(12) United States Patent
Tomishima

(10) Patent No.: US 9,361,972 B1
(45) Date of Patent: Jun. 7, 2016

(54) CHARGE LEVEL MAINTENANCE IN A MEMORY

(71) Applicant: INTEL CORPORATION, Santa Clara, CA (US)

(72) Inventor: Shigeki Tomishima, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/664,617

(22) Filed: Mar. 20, 2015

(51) Int. Cl.
  *G11C 7/00* (2006.01)
  *G11C 11/4096* (2006.01)
  *G11C 11/406* (2006.01)

(52) U.S. Cl.
  CPC .......... *G11C 11/4096* (2013.01); *G11C 11/406* (2013.01)

(58) Field of Classification Search
  CPC .......................... G11C 11/4096; G11C 11/406
  USPC ......................................... 365/203, 204, 222
  See application file for complete search history.

(56) References Cited

U.S. PATENT DOCUMENTS

| | | | | | |
|---|---|---|---|---|---|
| 5,495,440 | A | * | 2/1996 | Asakura | G11C 11/4097 365/149 |
| 5,675,530 | A | * | 10/1997 | Hirano | G11C 11/22 365/145 |
| 6,034,884 | A | * | 3/2000 | Jung | G11C 11/22 365/145 |
| 7,869,292 | B2 | * | 1/2011 | Yano | G11C 11/4091 365/203 |

OTHER PUBLICATIONS

Ahn, J.H., et al., "Adaptive Self Refresh Scheme for Battery Operated High-Density Mobile DRAM Applications", Proceedings of the 2006 IEEE Asian Solid-State Circuits Conference, Nov. 2006, 4 pp.

Ahn, J.H., et al., "An Experimental 256Mb Non-Volatile DRAM with Cell Plate Boosted Programming Technique", Proceedings of the 2004 IEEE International Solid-State Circuits Conference, 2004, 10 pp.

Aoki, M., et al., "A 1.5V DRAM for Battery-Based Applications", Proceedings of the 1989 IEEE International Solid-State Circuits Conference, 1989, 3 pp.

Asakura, M., et al., "Cell-Plate Line Connecting Complementary Bit-Line (C3) Architecture for Battery-Operating DRAM's", IEEE Journal of Solid-State Circuits, vol. 27, No. 4, Apr. 1992, 6 pp.

Fujishima, K., et al., "A Storage-Node-Boosted RAM with Word-Line Delay Compensation" IEEE Journal of Solid-State Circuits, vol. SC-17, No. 5, Oct. 1982, 5 pp.

Lim, K., et al., "Bit Line Coupling Scheme and Electrical Fuse Circuit for Reliable Operation of High Density DRAM", Proceedings of the 2001 Symposium on VLSI Circuits Digest of Technical Papers, 2001, 2 pp.

Takashima, D., et al., "A Novel Power-Off Mode for a Battery-Backup DRAM", IEEE Journal of Solid-State Circuits, vol. 32, No. 1, Jan. 1997, 6 pp.

(Continued)

Primary Examiner — Tha-O H Bui
(74) Attorney, Agent, or Firm — Konrad Raynes Davda & Victor LLP

(57) ABSTRACT

In one embodiment, a memory such as a dynamic random access memory employs charge boosting to bitcells prior to sensing charge levels in the storage nodes of the bitcells. It is believed that such an arrangement may be employed to improve bitcell read-out voltages, reduce refresh power consumption, improve restore voltage levels or other features, depending upon the particular application. Other aspects are described herein.

24 Claims, 7 Drawing Sheets

(56) References Cited

OTHER PUBLICATIONS

Wikipedia, "Dynamic Random-Access Memory", [online], last modified Feb. 5, 2015, [Retrieved on Feb. 16, 2015], retrieved from the Internet at <URL: http://en.wikipedia.org/wiki/Dynamic_random-Access_memory>, 20 pp.

Wikipedia, "Memory Refresh", [online], last modified Nov. 19, 2014, [Retrieved on Feb. 16, 2015], retrieved from the Internet at <URL: http://en.wikipedia.org/wiki/Memory_Refresh>, 20 pp.

* cited by examiner

CHARGE LEVEL MAINTENANCE IN A MEMORY

TECHNICAL FIELD

Certain embodiments of the present invention relate generally to memory in which a quantity of electrical charge is stored.

BACKGROUND

A dynamic random access memory (DRAM) has a bitcell for storing a bit as either a one or a zero. A DRAM bitcell can be relatively simple in design compared to the bitcells of other types of computer memories. In one DRAM bitcell design, the bitcell comprises primarily a capacitor which stores an electrical charge, the level of which represents either a one or zero stored in the bitcell. As a consequence, DRAM bitcells may frequently take up less space than other bitcell designs.

The bitcell also typically includes a cell switch transistor which in an off state, inhibits discharge of the charge stored on the bitcell capacitor. In the on state, the switching transistor connects the bitcell capacitor to read/write circuitry which can read the charge level stored on the capacitor and hence read the bit value stored in the bitcell. The cell switch transistor also connects the bitcell capacitor to read/write circuitry which can store charge on the bitcell capacitor at a level which "writes" a bit value into the bitcell. Access to a DRAM bitcell for read and write operations may frequently be carried out more quickly than many other bitcell designs.

However, even in the off state of the cell switch transistor, the charge stored on the storage capacitor of the DRAM bitcell tends to leak from the bitcell such that the stored charge level tends to decay over time. If the bitcell is not read before the charge level decays to a certain degree, such charge level decay can cause data loss and errors in reading the bit values stored in the bitcells.

To prevent such errors and loss, many DRAM designs include refresh circuitry which periodically refreshes the charge levels stored in the bitcells. Thus, even if there is a long delay before a bitcell is read, the refresh circuitry can maintain the stored charge level of the bitcell to preserve the bit data value of the bitcell until the data is needed. However, the refresh operations consume power which can shorten battery life in mobile applications.

In many DRAM designs, the refresh operation of a bitcell includes reading the bitcell in a sense phase of a bitcell refresh cycle. The bit data value read during the sense phase of the refresh cycle is often latched because the read operation usually destroys the charge level stored in the bitcell. The latched bit data value is then written back into the bitcell in a restoration phase of the refresh cycle, restoring the charge level to a level representing the read bit data value read from the bitcell, and completing the refresh cycle for that bitcell. The refresh cycle is periodically repeated to maintain the stored charge at a minimum level to ameliorate data loss and read errors.

In some devices, the refresh operations are controlled internally. Such internally controlled refresh is often referred to as "self-refresh." In order to decrease the power consumed by self-refresh operations (often referred to as IDD6 or Self-Refresh Power), various approaches have been proposed. In one such approach referred to as "partial refresh," all bitcells are not necessarily refreshed. For example, the refresh operations may be restricted to those bitcells containing the more important data which is to be retained while refresh operations are withheld from bitcells containing less important data which can be discarded. However, determining which data can be safely discarded can be problematical.

Another approach often referred to as "adaptive self-refresh" stores a data retention time value for each group of bitcells, such as a word line of bitcells of a bank of bitcells. For a word line of bitcells having a longer retention time value, the duration of time between refresh operations may be extended for a longer period of time as compared to a word line of bitcells having a shorter retention time value. For those bitcells of a word line for which the duration of time between refresh operations is extended, refresh power may be reduced. However, such schemes may have a large overhead cost in circuit complexity and die space consumed.

It is noted that the process technology for DRAM memory continues to shrink the DRAM bitcell and die size aggressively. As the DRAM dimensions shrink, the data retention periods tend to shrink as well. For example, for one DRAM memory design, the retention period has recently shrunk from 64 milliseconds (ms) to 32 ms. As a result, the frequency of refresh operations and the power consumed by such refresh operations, tend to increase as retention periods decrease.

Moreover, advances in process technology have permitted the memory density on a die to increase dramatically from 4 gigabytes (Gb), for example, to 8 Gb, 12 Gb and more. As a consequence the number of bitcells per die requiring refreshing and the associated power to refresh those additional cells, continue to increase. For example, if the number of refresh operations remains the same, the number of bitcells refreshed in each refresh operations will increase to accommodate the greater number of bitcells. Conversely, if the number of bitcells refreshed in each refresh operation remain the same, the number of refresh operations will increase to accommodate the increased number of bitcells. In either case, refresh power tends to increase as bitcell density increases.

BRIEF DESCRIPTION OF THE DRAWINGS

Embodiments of the present disclosure are illustrated by way of example, and not by way of limitation, in the figures of the accompanying drawings in which like reference numerals refer to similar elements.

FIG. 4b is a timing diagram depicting a comparison of the refresh cycle of FIG. 4a and a refresh cycle lacking the charge level maintenance of FIG. 4a.

DESCRIPTION OF EMBODIMENTS

Figure 1:
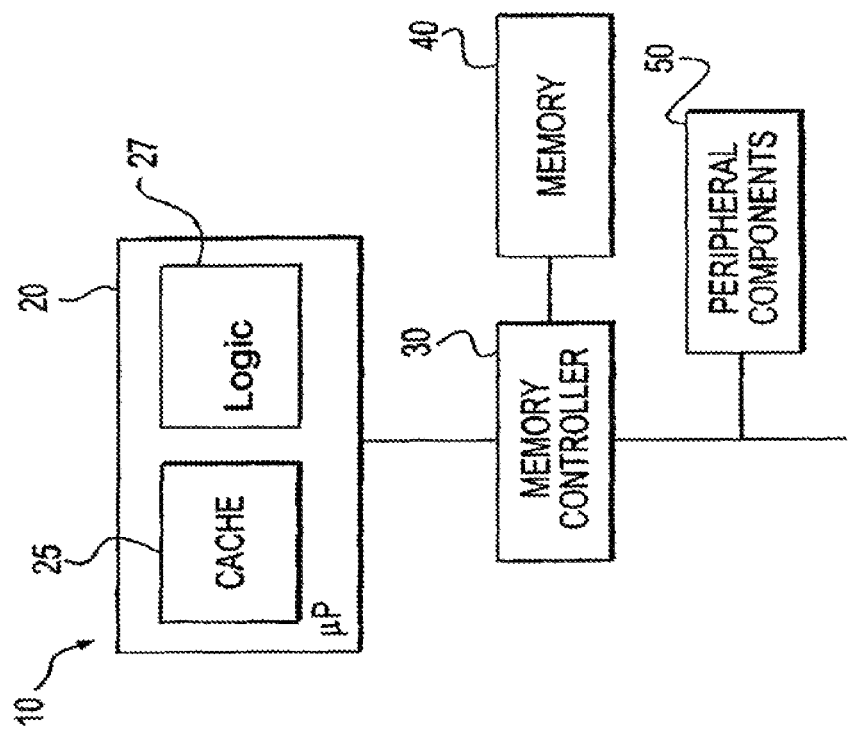
FIG. 1 depicts a high-level block diagram illustrating selected aspects of a system, employing charge level maintenance in accordance with an embodiment of the present disclosure.

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with one embodiment of this disclosure, the charge level of a bitcell of a memory is shifted to facilitate charge level maintenance. In one aspect of the present description, the charge level is boosted in association with periodic self-refreshing of the bitcells. In one example, the charge level boosting of the bitcell is initiated prior to the charge level sense phase of a refresh cycle. Such an arrangement is believed to facilitate charge level maintenance. As a result, in one embodiment, the read-out voltage of a bitcell may be increased, which may reduce bit read errors. In another aspect, the intervals between refresh cycles may be extended, thereby reducing the frequency of the refresh operations. In turn, by extending the intervals between refresh cycles, it is believed that the power consumed by the refresh operations may be reduced. As a result, battery life may extended in applications such as mobile operations, for example. In still another aspect, in some embodiments, the restore voltage may be achieved more quickly or more completely. It is appreciated that other aspects and advantages may be achieved, depending upon the particular application. Although described in connection with DRAM refresh cycles, it is appreciated that charge level boosting in accordance with the present description may be applied to other types of bitcell access events such as read or write operations.

In various computing applications, high performance in computing speed is often sought after. In other computing applications low power consumption is a goal. For still other computing applications including mobile applications such as smart phones and computer tablets, both high performance and low power consumption are notable considerations.

In order to facilitate operating a single or multi-core central processing unit (CPU) at high performance, large capacity memory devices are typically mounted in the same small package as the CPU to provide fast access for the CPU to the main memory. Such main memory devices are frequently Low Power DRAM (LPDRAM) devices because of their fast access speeds and high density of bitcells per unit of area of die space. Other memory designs such as nonvolatile Flash or MRAM (magneto-resistance random access memory) devices frequently have slower access speeds as compared to DRAM memory.

Conversely, the power consumed by the memory can provide an obstacle in various computing applications, particularly mobile applications in which battery life is a concern. In a DRAM device, it is recognized herein that the Array Refresh Power component of the IDD6 (Self-Refresh Power) power consumption is a significant factor.

The charge stored on the storage capacitor of the DRAM bitcell is periodically refreshed because the charge level tends to leak from the bitcell and thus tends to decay over time. Such charge leakage can occur due to various factors including sub-threshold leakage, junction leakage and bitcell capacitor leakage, for example. As explained in greater detail below, charge level maintenance in accordance with the present description can, in some embodiments, reduce power consumed by refresh operations and can improve data read reliability.

Although described in connection with DRAM memories, it is believed that charge level maintenance in accordance with the present description may be applied to other types of memory devices. Such devices in accordance with embodiments described herein can be used either in stand-alone memory circuits or logic arrays, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

Turning to the figures, FIG. 1 is a high-level block diagram illustrating selected aspects of a system implemented, according to an embodiment of the present disclosure. System 10 may represent any of a number of electronic and/or computing devices, that may include a memory device. Such electronic and/or computing devices may include computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a microprocessor 20, a memory controller 30, a memory 40 and peripheral components 50 which may include, for example, video controller, input device, output device, storage, network adapter, etc. The microprocessor 20 includes a cache 25 that may be part of a memory hierarchy to store instructions and data, and the system memory 40 may also be part of the memory hierarchy. Communication between the microprocessor 20 and the memory 40 may be facilitated by the memory controller (or chipset) 30, which may also facilitate in communicating with the peripheral components 50.

Storage of the peripheral components 50 may be, for example, non-volatile storage, such as solid-state drives magnetic disk drives, optical disk drives, a tape drive, flash memory, etc.). The storage may comprise an internal storage device or an attached or network accessible storage. The microprocessor 20 is configured to write data in and read data from the memory 40. Programs in the storage are loaded into the memory and executed by the processor. A network controller or adapter enables communication with a network, such as an Ethernet, a Fiber Channel Arbitrated Loop, etc. Further, the architecture may, in certain embodiments, include a video controller configured to render information on a display monitor, where the video controller may be embodied on a video card or integrated on integrated circuit components mounted on a motherboard or other substrate. An input device is used to provide user input to the processor, and may include a keyboard, mouse, pen-stylus, microphone, touch sensitive display screen, input pins, sockets, or any other activation or input mechanism known in the art. An output device is capable of rendering information transmitted from the processor, or other component, such as a display monitor, printer, storage, output pins, sockets, etc. The network adapter may embodied on a network card, such as a Peripheral Component Interconnect (PCI) card, PCI-express, or some other I/O card, or on integrated circuit components mounted on a motherboard or other substrate.

Figure 2:
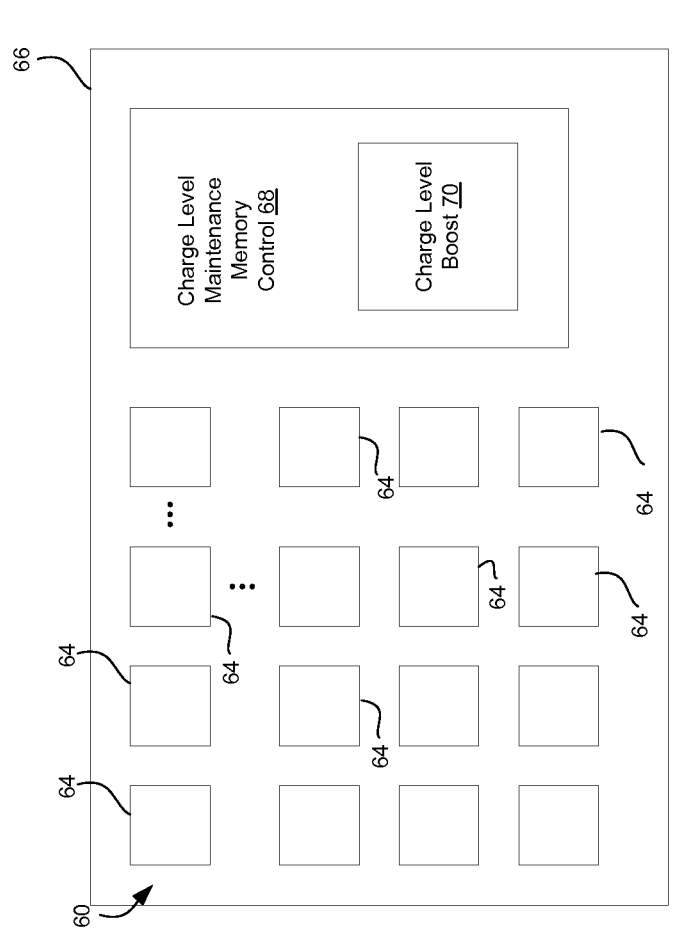
FIG. 2 depicts an example of a basic architecture of a DRAM, employing charge level maintenance in accordance with an embodiment of the present disclosure.

One or more of the components of the device 10 may be omitted, depending upon the particular application. For example, a network router may lack a video controller, for example. Any one or more of the memory devices 25, 40, and the other devices 10, 30, 50 may include charge level maintenance memory in accordance with the present description. FIG. 2 shows an example of an array 60 of rows and columns of bitcells 64 of a DRAM memory 66 in accordance with one embodiment of the present description. The DRAM memory 66 may also include a row decoder, a timer device and I/O devices (or I/O outputs). Bits of the same memory word may be separated from each other for efficient I/O design. A multiplexer (MUX) may be used to connect each column to the required circuitry during a READ operation. Another MUX may be used to connect each column to a write driver during a WRITE operation. A control circuit 68 performs read operations, write operations, refresh operations and charge level maintenance to the bitcells 64 as explained below. In the embodiment of FIG. 2, the charge level maintenance memory control 68 includes a charge level boost circuit 70 for boosting the charge level of the bitcells 64 as described in greater detail below. The control circuit 68 is configured to perform the described operations using appropriate hardware, software or firmware, or various combinations thereof.

Figure 3:
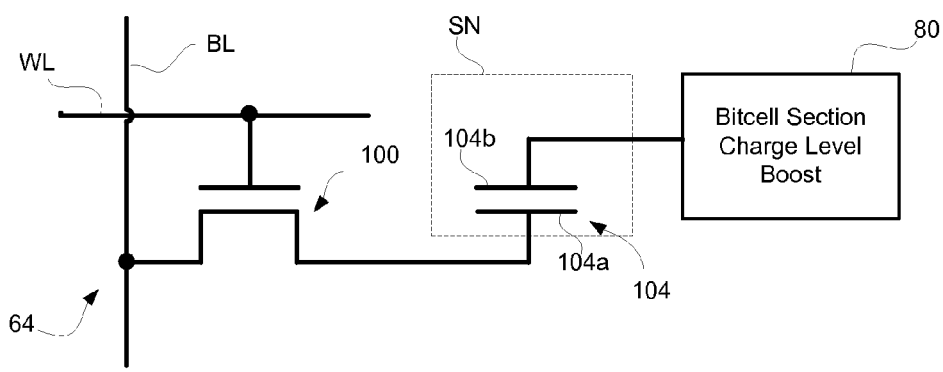
FIG. 3 shows an example of a bitcell of the DRAM of FIG. 2 in greater detail with an associated charge level boost circuit for charge level maintenance in accordance with an embodiment of the present disclosure.

FIG. 3 shows an example of a bitcell 64 of the array 60 of bitcells 64 and a bitcell section charge level boost circuit 80 for a section of bitcells 64 in accordance with one aspect of the present description. In one embodiment, the bitcell section charge level boost circuit 80 is a part of the charge level boost circuit 70 of the memory control circuit 68 (FIG. 2) and may be employed to boost the charge level of one or more bitcells 64 at a time, such as a section of bitcells 64 at a time.

In the embodiment of FIG. 3, the bitcell 64, comprises a cell switch transistor 100 and a storage node SN in the form of a storage capacitor 104. A cell plate 104a of the storage capacitor 104 is electrically coupled to a bit line BL when the cell switch transistor 100 is in a conductive state. The conductive and nonconductive states of the cell switch transistor 100 are controlled by an input gate coupled to a word line WL.

In this embodiment, a high voltage stored in the storage node SN represents a one stored in the bitcell 64. Conversely, a low voltage represents a zero. Thus, in one example, a high voltage such as greater than the bit line (BL) reference voltage (which may be one half Vcc, for example) stored in the storage node SN represents a one stored in the bitcell 64. Conversely, a low voltage less than the bit line (BL) reference voltage represents a zero. Although the bit line (BL) reference voltage is typically one half Vcc, it is appreciated that there are many variations in DRAM design such that the bit line (BL) reference voltage may be ground level, for example. Further, even in applications in which the typical level is one half Vcc, the reference level may be tuned lower or higher than the half Vcc level to adjust read margin, fail count, product variation or other factors.

The voltage exhibited by the storage node SN is a function of the charge level of the electrical charges stored in the storage capacitor 104. The charge level and hence the voltage level of the storage node 104 may be sensed by sense amplifier circuitry in the memory control 68 (FIG. 2) which controls the word line WL.

Figure 4A:
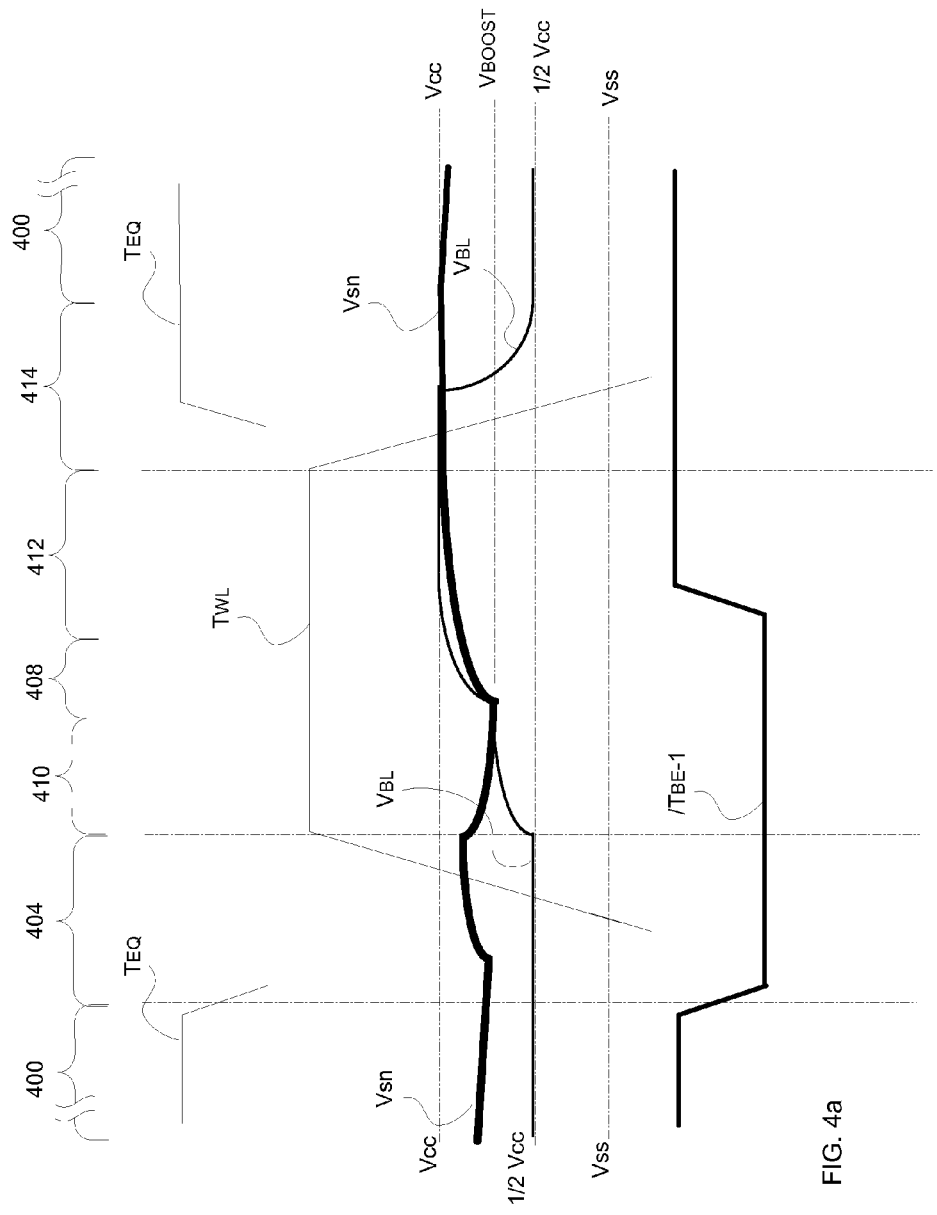
FIG. 4a is a timing diagram depicting one example of charge level maintenance in association with a self-refresh cycle, in accordance with an embodiment of the present disclosure.

As previously mentioned, the charge level stored in the storage node of a DRAM bitcell tends to decay over time. In the example of FIG. 4a, the bitcell stores a one value such that upon being refreshed, the charge level of the storage node SN is refreshed to a voltage level represented by Vcc which is, of course greater than one half Vcc. The voltage level of the storage node SN is represented by a graph line Vsn in FIG. 4a. The decay of the voltage level Vsn of the storage node SN from the refresh value of Vcc, is represented by a charge hold interval 400 of the graph line Vsn in FIG. 4a.

In accordance with one aspect of the present description, for each refresh cycle, the bitcell section charge level boost circuit 80 adds electrical charge to the storage node SN to boost the charge level stored in the storage node SN prior to the memory control 68 sensing the charge level stored in the storage node SN. The boost in charge level of the storage node SN is represented by the rising voltage VSN of the storage node SN over a charge adding interval 404, from the decayed value of the preceding charge hold interval 400 in FIGS. 4a, 4b.

In the illustrated embodiment, the memory control 68 (FIG. 3) senses the charge level of the storage node SN within a charge sensing interval 408 of a refresh cycle depicted in FIG. 4a. The beginning of the interval 408 is a function of the word line timing signal TWL and the sense amplifier circuitry. When the timing signal TWL becomes active (beginning of an interval 410 preceding interval 408), the cell switch transistor 100 (FIG. 3) switches to the conductive state, electrically coupling the storage capacitor 104 of the storage node SN to the bit line BL.

The voltage of the bit line BL is represented by the graph line VBL in FIG. 4a. Prior to the initiation of the interval 410, the voltage level VBL of the bit line BL is at the precharge level which is one half Vcc in this embodiment. As the cell switch transistor 100 becomes conductive in interval 410, charge is transferred from the storage node SN to the bit line BL. Hence, the voltage VSN of the storage node SN drops during the interval 410 and the voltage VBL of the bit line BL rises during the interval 410 until they reach the same voltage level since they are coupled by the conductive cell switch transistor 100. However, as a result of the charge level boost to the storage node SN by the bitcell section charge level boost circuit 80, the voltage VSN of the storage node SN drops during the interval 410 from a higher, boosted value than it otherwise would absent the charge level boost. Similarly, the voltage VBL of the bit line BL rises during the interval 410 to the higher read-out level VBOOST, a level higher than it would otherwise reach absent the charge level boost.

Figure 4B:
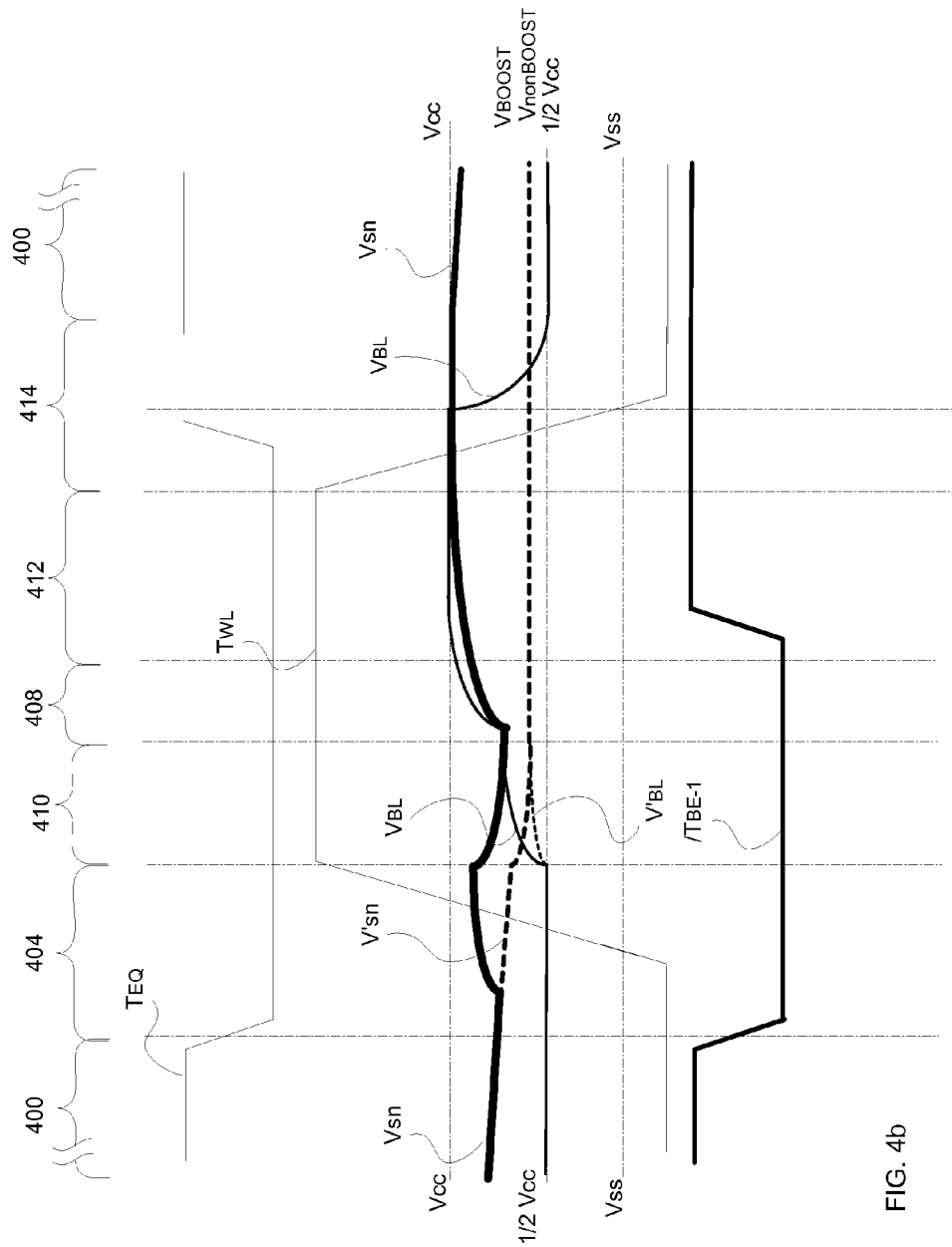

FIG. 4b depicts in phantom a storage node voltage V'SN representing the storage node voltage in the intervals 404-414 in the absence of a charge level boost by the bitcell section charge level boost circuit 80 in accordance with the present description. As shown in FIG. 4b, the storage node SN voltage level as represented by the graph line V'SN continues to decay unabated in the interval 404 in the absence of a charge level boost discussed above.

The voltage of the bit line BL is represented by the graph line V'BL in the intervals 404-414 in the absence of a charge level boost by the bitcell section charge level boost circuit 80 in accordance with the present description. As the cell switch transistor 100 becomes conductive in interval 410, charge is transferred from the storage node SN to the bit line BL. Hence, the voltage V'SN of the storage node SN drops during the interval 410 and the voltage V'BL of the bit line BL rises during the interval 410 until they reach the same voltage level since they are coupled by the conductive cell switch transistor 100. However, absent the charge level boost to the storage node SN by the bitcell section charge level boost circuit 80, the voltage V'SN of the storage node SN drops during the interval 410 to a lower nonboosted value VnonBOOST which is lower than the value VBOOST it would have reached had there had been a charge level boost in accordance with the present description. Similarly, the voltage V'BL of the bit line BL rises during the interval 410 to the lower nonboosted read-out value VnonBOOST, a value lower than the read-out value VBOOST it would have reached had there had been a charge level boost in accordance with the present description.

By providing charge level boost prior to sensing the storage node SN, the resultant read-out voltage level VBOOST of the voltage VBL of the bit line BL may be significantly higher than the lower nonboosted value VnonBOOST during the sense interval 408. As a result, the sense amplifier circuitry of the memory control 68 can more unambiguously distinguish a one from a zero, that is, sense that a one (rather than a zero) has been stored in the storage node SN. Accordingly, data read errors may be reduced in some applications.

The sense amplifier circuitry of the memory control 68 drives the voltage VSN of the storage node SN and the voltage VBL of the bit line BL upward back toward Vcc in the sense interval 408 and a restore interval 412. At the end of the restore interval 412, the memory control 68 changes the word line WL timing signal TWL to inactive, causing the cell switch transistor 100 to switch to the nonconductive state to hold the restored charge level of the storage node SN. The stored voltage level VSN will begin to decay again due to charge leakage due to various factors as discussed above. However, as a result of the charge level boost to the storage node SN by the bitcell section charge level boost circuit 80 each refresh cycle, the voltage VSN of the storage node SN will again drop to a higher value (VBOOST) prior to the sensing interval 408 than it otherwise would (that is, higher than VnonBOOST) during the interval 410 of the next refresh cycle. Similarly, the voltage VBL of the bit line BL will rise to the higher level VBOOST during the next refresh cycle, a level higher than it would otherwise reach (that is, higher than VnonBOOST) during the interval 410.

As a consequence, read sense errors due to low VSN voltages of the storage node due to charge leakage may be reduced or eliminated. In addition, the intervals between refresh cycles may be increased, thereby reducing the number of refresh cycles and reducing the power consumed by the refresh cycles. Still further, in some applications, the restore voltage may be higher or more complete.

Figure 5:
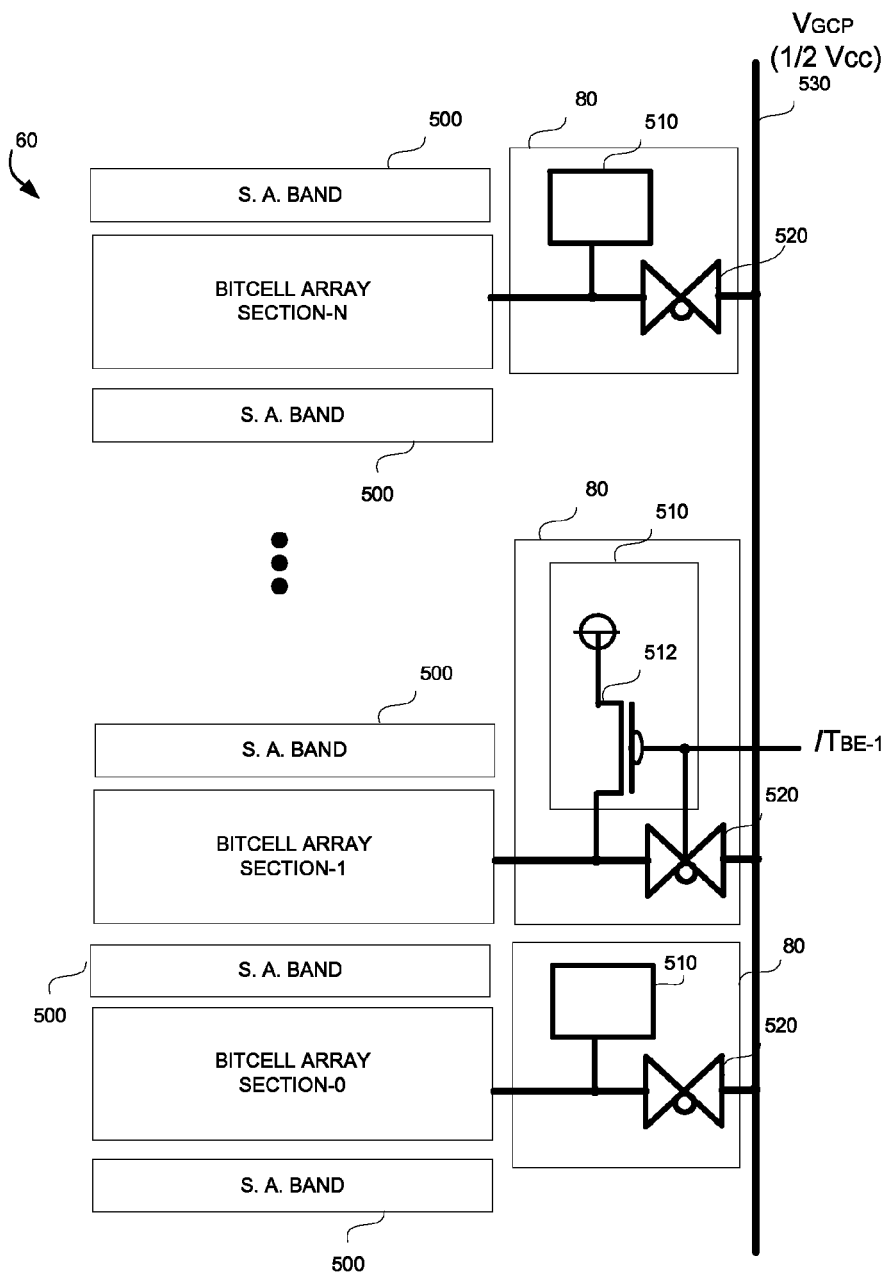
FIG. 5 is a schematic diagram of a bank of bitcells with associated charge level boost circuits for charge level maintenance in accordance with an embodiment of the present disclosure.

FIG. 5 shows another example of an array 60 of bitcells employing charge level maintenance in accordance with the present description. In this example, the array 60 is a bank of bitcells in which the bank is subdivided into a plurality of bitcell array sections, section0, section1 . . . sectionN, of bitcells. A memory may have many such banks of bitcell array sections. Adjacent each section of bitcells is a circuit area indicated as a "band" 500 which includes sense amplifiers for reading data from or writing data to, or refreshing the bitcells of the adjacent section. It is appreciated that the particular arrangement of bitcells 64 and bands 500 of sense amplifiers may vary, depending upon the particular application.

Each bitcell array section of sections section-0, section-1 . . . section-N, includes an array of DRAM bitcells 64, in which each bitcell may be similar to the bitcell example depicted in FIG. 3. The number of bitcells 64 in each section may range from as few as tens, to as many as millions or billions or more, depending upon the particular application. As previously mentioned, in one embodiment, the charge level boost circuit 80 can boost the charge levels of the storage nodes of more than one bitcell 64 at a time. In the embodiment of FIG. 5, each section, section-0, section-1 . . . section-N, has an associated bitcell section charge level boost circuit 80 which is coupled to a cell plate 104b of the storage node SN of each bitcell of the associated section as depicted in FIG. 3. It is appreciated that the number of charge level boost circuits 80 for a memory may vary, depending upon the particular application.

In one aspect of the present description, the bitcell section charge level boost circuit 80 for each DRAM bitcell section can boost the charge level of each bitcell 64 of the section at the same time. In this example, the charge level of each bitcell 64 of a section of bitcells is boosted in association with the self-refresh cycles of the section of bitcells. The various sections section-0, section-1 . . . section-N may be refreshed at different times. Accordingly, in this embodiment, each bitcell section section-0, section-1 . . . section-N has an associated bitcell section charge level boost circuit 80 which is activated in coordination with the refresh cycles for the section.

The bitcells 64 of each section are arranged in rows, in which each row has a Word Line (WL) conductor to access the bitcells 64 of the associated row for a data read, data write or refresh operations using a Word Line timing signal TWL (FIG. 4a). In this example, the bitcells 64 of each section are refreshed a row at a time. Accordingly, to refresh a particular row, the Word Line (WL) for that row is selected. Further, the bitcells 64 of each section are arranged in columns, in which each column has a Bit Line pair of complementary conductors BL and /BL to access a bitcell of the associated column of bit cells for a data read, data write or refresh operation and provide Bit Line signals VBL and /VBL, respectively.

As shown by the bitcell section charge level boost circuit 80 for the bitcell array section section-1, for example, each bitcell section charge level boost circuit 80 includes a driver circuit 510 which when activated, provides the additional charge to boost the charge levels of the storage nodes SN of the bitcells 64 of the associated bitcell array section, which is section-1 in this example. In this example, the driver circuit 510 includes a PMOS transistor 512. It is appreciated that other types of drivers circuits may be utilized to boost the charge level of a bitcell, depending upon the particular application. Each bitcell section charge level boost circuit 80 further includes a plate switch transistor 520 which functions as gate switch to electrical isolate the capacitor plate 104b (FIG. 3) of the storage nodes SN of the bitcells 64 of the bitcell array section section-1 from a global cell plate node 520 during charge level boost of the storage nodes SN.

Figure 6:
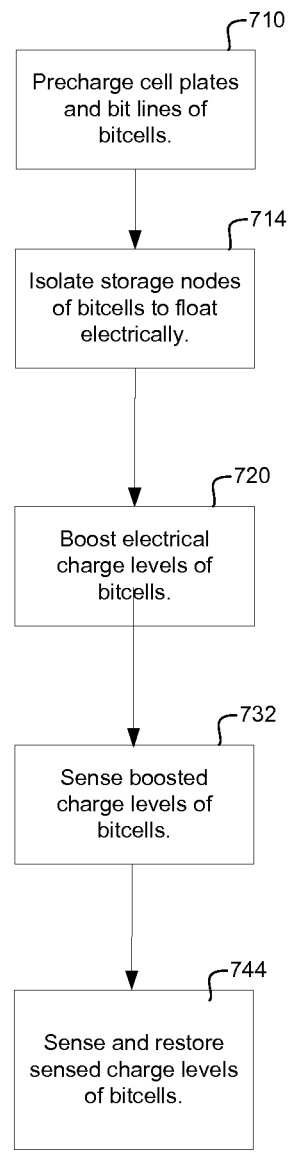
FIG. 6 is an example of operations for charge level maintenance in accordance with an embodiment of the present disclosure.

FIG. 6 depicts one example of self-refresh operations in which charge level boosting is employed. In one operation, cell plates and bit lines of the bitcells to be refreshed are precharged (block 710) to a particular voltage level. For example, when conductive, the plate switch transistor 520 (FIG. 5) of the bitcell section charge level boost circuit 80 electrically couples the capacitor plate 104b (FIG. 3) of the storage nodes SN of the bitcells 64 of the bitcell array section section-1 to the global cell plate node 530 to precharge the cell plate 104b of each bitcell 64 of the section-1 to the potential VGCP of the global cell plate 530. In this embodiment, the potential VGCP of the global cell plate 530 is a potential half way between the potential levels representing a one and zero. In this example, a one is represented by a potential greater than one half Vcc and a zero is represented by a potential less than one half Vcc. Hence, the potential VGCP is one half Vcc in the illustrated embodiment.

Prior to activating the Word Line timing signal TWL for a bitcell to be refreshed, the sense amplifiers of the sense amplifier band 500 are disconnected from the complementary bitcell bit lines BL and /BL of the bitcells to be refreshed, and the bitcell bit lines BL and /BL are precharged by precharge circuits which may be located in an adjacent band 500. The bitcell bit lines BL and /BL are precharged to equal voltage levels in a timing interval in which the timing signal TEQ (FIG. 4*a*) is active as represented in interval 400. The equal voltage level to which the bitcell bit lines BL and /BL are precharged is again, a potential half way between the potential levels representing a one and zero, or one half Vcc in this example, the same as the global cell plate potential VGCP. The bitcell bit line potential VBL for the bit line BL precharged to the potential one half Vcc is depicted in interval 400 of FIG. 4*a*.

Following the precharge, the precharge circuits of the associated band 500 are turned off as indicated by the precharge timing signal TEQ changing state to the inactive state at the end of timing interval 400 and the beginning of timing interval 404. The precharge voltages (one half Vcc) of the bit lines BL and /BL are maintained a sufficient amount of time by the matching capacitances of the bit lines BL and /BL.

In another operation, the storage nodes SN of the bitcells to be refreshed are isolated (block 714, FIG. 6) to float electrically. In one embodiment, the bitcell section charge level boost circuit 80 is activated by a boost enable timing signal /TBE such as the boost enable signal /TBE-1 for section-1 of FIG. 5. As shown in FIG. 4*a*, the boost enable timing signal /TBE for each section of the bank, as represented by the boost enable signal /TBE-1 for section-1, for example, is activated when the precharge timing signal TEQ for the bank becomes inactive at the end of timing interval 400 and the beginning of timing interval 404.

Note that in this embodiment, the Word Line timing signal TWL is inactive in at least an initial portion of the timing interval 404 when the boost enable timing signal /TBE-1 and the bitcell section charge level boost circuit 80 are active. Because the Word Line timing signal TWL is inactive, the cell switch transistor 100 of each bitcell of the Word Line WL is in a nonconductive state. Hence, the storage node SN of the bitcell is electrically isolated from the bit line BL of the bitcell. Moreover, the boost enable timing signal /TBE-1 also switches the plate switch transistor 520 to a nonconductive state to electrically isolate the capacitor plate 104*b* (FIG. 3) of the storage nodes SN of the bitcells 64 of the bitcell array section-1 from the global cell plate node 530 during charge level boost of the storage nodes SN. As a result of the nonconductive states of the cell switch transistor 100 of each bitcell of the Word Line WL, and the plate switch transistor 520 of the bitcell section charge level boost circuit 80, the storage nodes SN of the bitcells of the Word Line WL are effectively floating electrically.

Because the storage nodes SN of the selected section-1 are floating electrically, the capacitance seen by the bitcell section charge level boost circuit 80 for the selected section-1 is relatively low. For example, it is believed that the effective capacitance is effectively that of the conductors coupling the bitcell section charge level boost circuit 80 to the storage nodes SN of the selected section-1, rather than the capacitances of the capacitors 104 of the storage nodes. As a result, it is believed that the energy utilized and power consumed by the bitcell section charge level boost circuit 80 to boost the charge levels of the storage nodes SN of the selected section-1 may be relatively low.

In one embodiment, the boost enable timing signal /TBE-1, /TBE-2, . . . /TBE-N, for each section, section-0, section-1, . . . section-N, respectively, may be activated at different times following the precharge timing signal TEQ for the bank becoming inactive at the end of timing interval 400. For those sections not yet selected by activating the associated boost enable timing signal /TBE for that section, the plate switch transistor 520 (FIG. 5) of the associated bitcell section charge level boost circuit 80 continues to electrically couple the capacitor plate 104*b* (FIG. 3) of the storage nodes SN of the bitcells 64 of the nonselected bitcell array section to the global cell plate node 530 to continue to precharge the cell plate 104*b* of each bitcell 64 of the section to the potential VGCP of the global cell plate 530, until the section is selected by activating the associated boost enable timing signal /TBE-1, /TBE-2, . . . /TBE-N, for the associated section, section-0, section-1, . . . section-N. In other embodiments, the boost enable timing signal /TBE-1, /TBE-2, . . . /TBE-N, for each section, section-0, section-1, . . . section-N, respectively, may be activated at the same time following the precharge timing signal TEQ for the bank becoming inactive at the end of timing interval 400.

With respect to the selected section-1 of FIG. 4*a*, the boost enable timing signal /TBE-1 also activates the driver transistor 512 of the driver circuit 510 to initiate charge level boosting (block 720, FIG. 6) of the storage nodes SN of the bitcells of the selected section-1 to be refreshed. In the example of FIG. 5, the driver transistor 512 when conductive, provides the additional charge to boost the charge levels of the storage nodes SN of the bitcells 64 of the associated bitcell array section, which is section-1 in this example. As previously mentioned, it is believed that the energy utilized and power consumed by the bitcell section charge level boost circuit 80 to boost the charge levels of the storage nodes SN of the selected section-1 may be relatively low, due to the electrical isolation of the storage nodes SN of the selected section-1.

In the illustrated embodiment, the boost enable timing signal for each section such as the boost enable timing signal /TBE-1 for section-1, for example, is made active before the Word Line WL timing signal TWL is made active for each row to be refreshed as shown in FIG. 4*a*. Thus, the bitcell section charge level boost circuit 80 is activated not only to isolate the storage nodes SN from the global cell plate node 530, but also to add electrical charge to the storage node SN before the cell switch transistor 100 of each bitcell of the Word Line WL switches to the conductive state which would electrically couple the storage node SN of the bitcell to the bit line BL of the bitcell.

The boost in charge level of the storage node SN of a bitcell of the row of bitcells of section-1 to be refreshed, is represented by the rising voltage VSN of the storage node SN over the charge adding interval 404 prior to the Word Line timing signal TWL becoming active following timing interval 404, from the decayed value of the preceding interval 400 in FIG. 4*a*. In the example of FIG. 4*a*, the voltage VSN of the storage node SN of the bitcell is greater than the precharge level of the bit line BL since the bitcell stores a one rather than a zero in the example of FIG. 4*a*.

In the illustrated embodiment, the memory control 68 (FIG. 3) senses, that is, reads (block 732, FIG. 6) the charge level of the storage node SN as represented by the voltage VSN of the storage node SN of the bitcell, within the charge sensing interval 408 of a refresh cycle depicted in FIG. 4*a*. The beginning of the interval 408 is a function of the word line timing signal TWL and the sense amplifier circuitry. When the timing signal TWL becomes active (beginning of the interval 410 preceding sensing interval 408), the cell switch transistor 100 (FIG. 3) switches to the conductive state, electrically coupling the storage capacitor 104 of the storage node SN to the bit line BL.

As previously mentioned, the voltage of the bit line BL is represented by the graph line VBL in FIG. 4*a*. Prior to the initiation of the interval 410, the voltage level VBL of the bit line BL is at the precharge level which is one half Vcc in this embodiment. As the cell switch transistor 100 becomes conductive in interval 410, charge is transferred from the storage node SN to the bit line BL since the voltage VSN of the storage node SN of the bitcell is greater than the precharge level of the bit line BL since the bitcell stores a one rather than a zero in the example of FIG. 4a. Hence, the voltage VSN of the storage node SN drops during the interval 410 and the voltage VBL of the bit line BL rises during the interval 410 until they reach the same voltage level since they are coupled by the conductive cell switch transistor 100. However, as a result of the charge level boost to the storage node SN by the bitcell section charge level boost circuit 80, the voltage VSN of the storage node SN drops during the interval 410 from a higher, boosted value than it otherwise would absent the charge level boost. Similarly, the voltage VBL of the bit line BL rises during the interval 410 to the higher level VBOOST, a level higher than it would otherwise reach (represented by the level VnonBOOST, (FIG. 4b) absent the charge level boost. In this manner, the read out voltage may be increased, the interval between refresh cycles increased or other aspects may be achieved.

In the illustrated embodiment, the higher level VBOOST may be, for example, 100 millivolts higher than level VnonBOOST (FIG. 4b) achieved without charge level boosting in accordance with the present description. Thus, by providing charge level boost prior to sensing the storage node SN, the resultant voltage level VBOOST of the voltage VBL of the bit line BL may be significantly higher than one half Vcc during the sense interval 408 As a result, the sense amplifier circuitry of the memory control 68 can more unambiguously distinguish a one from a zero, that is, sense that a one (rather than a zero) has been stored in the storage node SN. As a consequence, read sense errors due to low VSN voltages of the storage node due to charge leakage may be reduced or eliminated. In addition, the intervals between refresh cycles may be increased without increasing data loss, thereby reducing the number of refresh cycles and reducing the power consumed by the refresh cycles. It is appreciated that the level of charge boosting applied may vary, depending upon the particular application.

In another operation, the sensed charge levels of the row of bitcells being refreshed within the selected section are sensed and restored (block 744, FIG. 6). Accordingly, the sense amplifier circuitry of the memory control 68 drives the voltage VSN of the storage node SN and the voltage VBL of the bit line BL upward back toward Vcc in the sense interval 408 and a restore interval 412.

During the restore interval 412, the boost enable timing signal for the selected section such as the boost enable timing signal /TBE-1 for section-1, for example, may be inactivated as shown in FIG. 4a. In one embodiment, the boost enable timing signal /TBE changes state to the inactive state after the sense interval 410 due to the sensitivity of the sense amplifiers of the band 500 during the sense interval 408.

In another aspect of the present description, because the charge level of the storage node SN as represented by the voltage VSN is being restored from the higher voltage level VBOOST, restoration of the voltage VSN to Vcc in the restore interval may be facilitated. For example, restoration may, in some embodiments, be completed more quickly, and in some embodiments, more completely to the full restoration value Vcc.

At the end of the restore interval 412, and within the next timing interval 414, the memory control 68 changes the word line WL timing signal TWL for the row of bitcells of the selected section to inactive, causing the cell switch transistor 100 to switch to the nonconductive state to hold the restored charge level of the storage node SN. At this time, the boost enable timing signal /TBE has previously changed state to the inactive state after the sense interval 410. In addition the precharge timing signal TEQ changes state back to the active state, driving the bit line voltage VBL back to the precharge level, one half Vcc as shown in FIG. 4a.

The stored voltage level VSN will begin to decay again over the next charge hold interval 400 due to charge leakage due to various factors as discussed above. However, as a result of the charge level boost to the storage node SN by the bitcell section charge level boost circuit 80 each refresh cycle, the voltage VSN of the storage node SN will again drop to a higher value (VBOOST) than it otherwise would (VnonBOOST) during the interval 410 of the next refresh cycle. Similarly, the voltage VBL of the bit line BL will rise to the higher level VBOOST during the next refresh cycle, a level higher than it would otherwise reach (VnonBOOST) during the interval 410.

In the embodiment of FIGS. 4a, 4b, the value stored in the bitcell is a one. It is believed that charge level maintenance in accordance with the present description is applicable also to bitcells storing a zero. The charge level of bitcells storing a zero may also be boosted from an initial voltage level such as Vss, for example, to a higher value as a result of the boosted charge level. However, in some embodiments, the charge level is boosted by an amount such that the boosted voltage level of the total charge stored in the storage node SN of the bitcell storing a zero, remains within the range representing a zero, such as less than one half Vcc, for example. Hence, the boosted voltage level will be reduced back to the voltage level Vss (FIG. 4a) during the sense and restore intervals of the refresh cycle for a bitcell storing a zero.

EXAMPLES

The following examples pertain to further embodiments.

Example 1 is an apparatus, comprising: an array of dynamic random access memory (DRAM) cells, each cell having a storage node; and a memory controller coupled to the array of DRAM cells, the memory controller including sense amplifiers configured to sense and restore a charge level in a storage node of a DRAM cell of the array, and a charge level boost circuit configured to add charge to the storage node of the cell to boost the charge level of the storage node of the cell; wherein the memory controller is configured to control the charge level boost circuit to initiate adding charge to the storage node of the cell to boost the charge level of the storage node of the cell prior to sensing a charge level of the storage node of the cell; and wherein the memory controller is configured to control sense amplifiers to sense a boosted charge level stored in the cell after the charge adding has been initiated to add charge to boost the charge level of the storage node, and to restore a charge level in the cell as a function of the sensed boosted charge level.

In Example 2, the subject matter of Examples 1-9 (excluding the present example) can optionally include wherein the memory controller is configured to periodically refresh the cell of the DRAM array in refresh intervals, including controlling the charge level boost circuit to initiate the charge adding to the storage node of the cell to boost the charge level of the storage node of the cell being refreshed prior to the sense amplifiers sensing the boosted charge level of the storage node of the cell being refreshed, and restoring the charge level of the cell being refreshed as a function of the sensed boosted charge level.

In Example 3, the subject matter of Examples 1-9 (excluding the present example) can optionally include a bit line, wherein the cell comprises a switch transistor having a conductive state configured to electrically couple the storage node of the cell to the bit line in the conductive state, and wherein the memory controller is configured to switch the cell switch transistor to a conductive state to electrically couple the storage node of the cell to the bit line to initiate the boosted charge level sensing of the cell being refreshed.

In Example 4, the subject matter of Examples 1-9 (excluding the present example) can optionally include wherein the charge level boost circuit includes a drive transistor coupled to the storage node of the cell and configured to, when enabled, boost the charge level of the storage node of the cell.

In Example 5, the subject matter of Examples 1-9 (excluding the present example) can optionally include wherein the charge level boost circuit includes a plate switch transistor, and wherein the storage node of each cell includes a storage capacitor having one plate coupled to the cell switch transistor of the cell, and another plate coupled to the plate switch transistor, the memory controller being configured to switch the plate switch transistor to a nonconductive state so that the storage capacitor of the cell is electrically floating during at least a portion of the charge adding.

In Example 6, the subject matter of Examples 1-9 (excluding the present example) can optionally include wherein the memory controller is configured to enable the drive transistor to boost the charge level of the storage node of the cell while the plate switch transistor is in a nonconductive state.

In Example 7, the subject matter of Examples 1-9 (excluding the present example) can optionally include wherein memory controller is configured to enable the drive transistor to boost the charge level of the storage node of the cell prior to switching the cell switch transistor to the conductive state to initiate the charge level sensing.

In Example 8, the subject matter of Examples 1-9 (excluding the present example) can optionally include wherein the memory controller is configured to switch the cell switch transistor to the conductive state while the drive transistor is enabled and to disable the drive transistor to terminate the charge boosting before switching the cell switch transistor to the nonconductive state.

In Example 9, the subject matter of Examples 1-9 (excluding the present example) can optionally include a computing system for use with a display, comprising:
a memory including said array of DRAM cells and said memory controller;
a processor configured to write data in and read data from the memory; and
a video controller configured to display information represented by data in the memory.

Example 10 is a computing system for use with a display, comprising: a memory; a processor configured to write data in and read data from the memory; a video controller configured to display information represented by data in the memory; wherein the memory includes a dynamic random access memory (DRAM), comprising: an array of dynamic random access memory (DRAM) cells, each cell having a storage node; and a memory controller coupled to the array of DRAM cells, the memory controller including sense amplifiers configured to sense and restore a charge level in a storage node of a DRAM cell of the array, and a charge level boost circuit configured to add charge to the storage node of the cell to boost the charge level of the storage node of the cell; wherein the memory controller is configured to control the charge level boost circuit to initiate adding charge to the storage node of the cell to boost the charge level of the storage node of the cell prior to sensing a charge level of the storage node of the cell; and wherein the memory controller is configured to control sense amplifiers to sense a boosted charge level stored in the cell after the charge adding has been initiated to add charge to boost the charge level of the storage node, and to restore a charge level in the cell as a function of the sensed boosted charge level.

In Example 11, the subject matter of Examples 10-17 (excluding the present example) can optionally include wherein the memory controller is configured to periodically refresh the cell of the DRAM array in refresh intervals, including controlling the charge level boost circuit to initiate the charge adding to the storage node of the cell to boost the charge level of the storage node of the cell being refreshed prior to the sense amplifiers sensing the boosted charge level of the storage node of the cell being refreshed, and restoring the charge level of the cell being refreshed as a function of the sensed boosted charge level.

In Example 12, the subject matter of Examples 10-17 (excluding the present example) can optionally include wherein the memory further comprises a bit line, wherein the cell comprises a switch transistor having a conductive state configured to electrically couple the storage node of the cell to the bit line in the conductive state, and wherein the memory controller is configured to switch the cell switch transistor to a conductive state to electrically couple the storage node of the cell to the bit line to initiate the boosted charge level sensing of the cell being refreshed.

In Example 13, the subject matter of Examples 10-17 (excluding the present example) can optionally include wherein the charge level boost circuit includes a drive transistor coupled to the storage node of the cell and configured to, when enabled, boost the charge level of the storage node of the cell.

In Example 14, the subject matter of Examples 10-17 (excluding the present example) can optionally include wherein the charge level boost circuit includes a plate switch transistor, and wherein the storage node of each cell includes a storage capacitor having one plate coupled to the cell switch transistor of the cell, and another plate coupled to the plate switch transistor, the memory controller being configured to switch the plate switch transistor to a nonconductive state so that the storage capacitor of the cell is electrically floating during at least a portion of the charge adding.

In Example 15, the subject matter of Examples 10-17 (excluding the present example) can optionally include wherein the memory controller is configured to enable the drive transistor to boost the charge level of the storage node of the cell while the plate switch transistor is in a nonconductive state.

In Example 16, the subject matter of Examples 10-17 (excluding the present example) can optionally include wherein memory controller is configured to enable the drive transistor to boost the charge level of the storage node of the cell prior to switching the cell switch transistor to the conductive state to initiate the charge level sensing.

In Example 17, the subject matter of Examples 10-17 (excluding the present example) can optionally include wherein the memory controller is configured to switch the cell switch transistor to the conductive state while the drive transistor is enabled and to disable the drive transistor to terminate the charge boosting before switching the cell switch transistor to the nonconductive state.

Example 18 is a method, comprising: prior to sensing a charge level of a storage node of a cell of a dynamic random access memory (DRAM), adding charge to the storage node of the cell to boost the charge level of the storage node of the cell; sensing a boosted charge level stored in the cell after the charge adding has been initiated to add charge to boost the charge level of the storage node; and restoring a charge level in the cell as a function of the sensed boosted charge level.

In Example 19, the subject matter of Examples 18-29 (excluding the present example) can optionally include periodically refreshing the cell of the DRAM in refresh intervals wherein the refreshing includes the charge adding, the charge level sensing and the charge level restoring.

In Example 20, the subject matter of Examples 18-29 (excluding the present example) can optionally include wherein the refreshing includes switching a cell switch transistor to a conductive state to electrically couple the storage node of the cell to a bit line of the DRAM, and wherein the charge level sensing is initiated by the switch transistor conductive state.

In Example 21, the subject matter of Examples 18-29 (excluding the present example) can optionally include wherein the charge adding includes enabling a drive transistor to boost the charge level of the storage node of the cell.

In Example 22, the subject matter of Examples 18-29 (excluding the present example) can optionally include wherein the storage node includes a storage capacitor having one plate coupled to the cell switch transistor and another plate coupled to a plate switch transistor, the charge adding includes switching the plate switch transistor to a nonconductive state so that the storage capacitor is electrically floating during at least a portion of the charge adding.

In Example 23, the subject matter of Examples 18-29 (excluding the present example) can optionally include wherein the charge adding includes enabling the drive transistor to boost the charge level of the storage node of the cell while the plate switch transistor is in a nonconductive state.

In Example 24, the subject matter of Examples 18-29 (excluding the present example) can optionally include wherein the charge adding includes enabling the drive transistor to boost the charge level of the storage node of the cell prior to switching the cell switch transistor to the conductive state to initiate the charge level sensing.

In Example 25, the subject matter of Examples 18-29 (excluding the present example) can optionally include wherein the cell switch transistor is switched to the conductive state while the drive transistor is enabled and wherein the drive transistor is disabled to terminate the charge boosting before the cell switch transistor switches to the nonconductive state.

In Example 25, the subject matter of Examples 18-29 (excluding the present example) can optionally include periodically refreshing the cell of the DRAM in refresh intervals wherein the refreshing includes the charge adding, the charge level sensing and the charge level restoring, and switching a cell switch transistor to a conductive state to electrically couple the storage node of the cell to a bit line of the DRAM, and wherein the charge level sensing is initiated by the switch transistor conductive state.

In Example 27, the subject matter of Examples 18-29 (excluding the present example) can optionally include wherein the charge adding includes enabling a drive transistor to boost the charge level of the storage node of the cell.

In Example 28, the subject matter of Examples 18-29 (excluding the present example) can optionally include wherein the storage node includes a storage capacitor having one plate coupled to the cell switch transistor and another plate coupled to a plate switch transistor, the charge adding includes switching the plate switch transistor to a nonconductive state so that the storage capacitor is electrically floating during at least a portion of the charge adding, and includes enabling the drive transistor to boost the charge level of the storage node of the cell while the plate switch transistor is in a nonconductive state.

In Example 29, the subject matter of Examples 18-29 (excluding the present example) can optionally include wherein the charge adding includes enabling the drive transistor to boost the charge level of the storage node of the cell prior to switching the cell switch transistor to the conductive state to initiate the charge level sensing, wherein the cell switch transistor is switched to the conductive state while the drive transistor is enabled and wherein the drive transistor is disabled to terminate the charge boosting before the cell switch transistor switches to the nonconductive state.

Example 30 is an apparatus comprising means to perform a method as claimed in any preceding claim.

The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art. Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. An apparatus, comprising:
   an array of dynamic random access memory (DRAM) cells, each cell having a storage node; and
   a memory controller coupled to the array of DRAM cells, the memory controller including sense amplifiers configured to sense and restore a charge level in a storage node of a DRAM cell of the array, and a charge level boost circuit configured to add charge to the storage node of the cell to boost the charge level of the storage node of the cell;
   wherein the memory controller is configured to control the charge level boost circuit to initiate adding charge to the storage node of the cell to boost the charge level of the storage node of the cell prior to sensing a charge level of the storage node of the cell; and
   wherein the memory controller is configured to control sense amplifiers to sense a boosted charge level stored in the cell after the charge adding has been initiated to add charge to boost the charge level of the storage node, and to restore a charge level in the cell as a function of the sensed boosted charge level.

2. The apparatus of claim 1 wherein the memory controller is configured to periodically refresh the cell of the DRAM array in refresh intervals, including controlling the charge level boost circuit to initiate the charge adding to the storage node of the cell to boost the charge level of the storage node of the cell being refreshed prior to the sense amplifiers sensing the boosted charge level of the storage node of the cell being refreshed, and restoring the charge level of the cell being refreshed as a function of the sensed boosted charge level.

3. The apparatus of claim 2 further comprising a bit line, wherein the cell comprises a switch transistor having a conductive state configured to electrically couple the storage node of the cell to the bit line in the conductive state, and wherein the memory controller is configured to switch the cell switch transistor to a conductive state to electrically couple the storage node of the cell to the bit line to initiate the boosted charge level sensing of the cell being refreshed.

4. The apparatus of claim 3 wherein the charge level boost circuit includes a drive transistor coupled to the storage node of the cell and configured to, when enabled, boost the charge level of the storage node of the cell.

5. The apparatus of claim 4 wherein the charge level boost circuit includes a plate switch transistor, and wherein the storage node of each cell includes a storage capacitor having one plate coupled to the cell switch transistor of the cell, and another plate coupled to the plate switch transistor, the memory controller being configured to switch the plate switch transistor to a nonconductive state so that the storage capacitor of the cell is electrically floating during at least a portion of the charge adding.

6. The apparatus of claim 5 wherein the memory controller is configured to enable the drive transistor to boost the charge level of the storage node of the cell while the plate switch transistor is in a nonconductive state.

7. The apparatus of claim 6 wherein memory controller is configured to enable the drive transistor to boost the charge level of the storage node of the cell prior to switching the cell switch transistor to the conductive state to initiate the charge level sensing.

8. The apparatus of claim 7 wherein the memory controller is configured to switch the cell switch transistor to the conductive state while the drive transistor is enabled and to disable the drive transistor to terminate the charge boosting before switching the cell switch transistor to the nonconductive state.

9. A computing system for use with a display, comprising:
   a memory;
   a processor configured to write data in and read data from the memory;
   a video controller configured to display information represented by data in the memory;
   wherein the memory includes a dynamic random access memory (DRAM), comprising:
      an array of dynamic random access memory (DRAM) cells, each cell having a storage node; and
      a memory controller coupled to the array of DRAM cells, the memory controller including sense amplifiers configured to sense and restore a charge level in a storage node of a DRAM cell of the array, and a charge level boost circuit configured to add charge to the storage node of the cell to boost the charge level of the storage node of the cell;
      wherein the memory controller is configured to control the charge level boost circuit to initiate adding charge to the storage node of the cell to boost the charge level of the storage node of the cell prior to sensing a charge level of the storage node of the cell; and
      wherein the memory controller is configured to control sense amplifiers to sense a boosted charge level stored in the cell after the charge adding has been initiated to add charge to boost the charge level of the storage node, and to restore a charge level in the cell as a function of the sensed boosted charge level.

10. The system of claim 9 wherein the memory controller is configured to periodically refresh the cell of the DRAM array in refresh intervals, including controlling the charge level boost circuit to initiate the charge adding to the storage node of the cell to boost the charge level of the storage node of the cell being refreshed prior to the sense amplifiers sensing the boosted charge level of the storage node of the cell being refreshed, and restoring the charge level of the cell being refreshed as a function of the sensed boosted charge level.

11. The system of claim 10 wherein the memory further comprises a bit line, wherein the cell comprises a switch transistor having a conductive state configured to electrically couple the storage node of the cell to the bit line in the conductive state, and wherein the memory controller is configured to switch the cell switch transistor to a conductive state to electrically couple the storage node of the cell to the bit line to initiate the boosted charge level sensing of the cell being refreshed.

12. The system of claim 11 wherein the charge level boost circuit includes a drive transistor coupled to the storage node of the cell and configured to, when enabled, boost the charge level of the storage node of the cell.

13. The system of claim 12 wherein the charge level boost circuit includes a plate switch transistor, and wherein the storage node of each cell includes a storage capacitor having one plate coupled to the cell switch transistor of the cell, and another plate coupled to the plate switch transistor, the memory controller being configured to switch the plate switch transistor to a nonconductive state so that the storage capacitor of the cell is electrically floating during at least a portion of the charge adding.

14. The system of claim 13 wherein the memory controller is configured to enable the drive transistor to boost the charge level of the storage node of the cell while the plate switch transistor is in a nonconductive state.

15. The system of claim 14 wherein memory controller is configured to enable the drive transistor to boost the charge level of the storage node of the cell prior to switching the cell switch transistor to the conductive state to initiate the charge level sensing.

16. The system of claim 15 wherein the memory controller is configured to switch the cell switch transistor to the conductive state while the drive transistor is enabled and to disable the drive transistor to terminate the charge boosting before switching the cell switch transistor to the nonconductive state.

17. A method, comprising:
prior to sensing a charge level of a storage node of a cell of a dynamic random access memory (DRAM), initiating adding charge to the storage node of the cell to boost the charge level of the storage node of the cell;
sensing a boosted charge level stored in the cell after the charge adding has been initiated to add charge to boost the charge level of the storage node; and
restoring a charge level in the cell as a function of the sensed boosted charge level.

18. The method of claim 17 further comprising:
periodically refreshing the cell of the DRAM in refresh intervals wherein the refreshing includes the charge adding, the charge level sensing and the charge level restoring.

19. The method of claim 18 wherein the refreshing includes switching a cell switch transistor to a conductive state to electrically couple the storage node of the cell to a bit line of the DRAM, and wherein the charge level sensing is initiated by the switch transistor conductive state.

20. The method of claim 19 wherein the charge adding includes enabling a drive transistor to boost the charge level of the storage node of the cell.

21. The method of claim 20 wherein the storage node includes a storage capacitor having one plate coupled to the cell switch transistor and another plate coupled to a plate switch transistor, the charge adding includes switching the plate switch transistor to a nonconductive state so that the storage capacitor is electrically floating during at least a portion of the charge adding.

22. The method of claim 21 wherein the charge adding includes enabling the drive transistor to boost the charge level of the storage node of the cell while the plate switch transistor is in a nonconductive state.

23. The method of claim 22 wherein the charge adding includes enabling the drive transistor to boost the charge level of the storage node of the cell prior to switching the cell switch transistor to the conductive state to initiate the charge level sensing.

24. The method of claim 23 wherein the cell switch transistor is switched to the conductive state while the drive transistor is enabled and wherein the drive transistor is disabled to terminate the charge boosting before the cell switch transistor switches to the nonconductive state.

* * * * *